(12) United States Patent
Singer et al.

(10) Patent No.: US 11,800,666 B2
(45) Date of Patent: Oct. 24, 2023

(54) TEMPORARY REMOVABLE MODULE LID

(71) Applicant: INTERNATIONAL BUSINESS MACHINES CORPORATION, Armonk, NY (US)

(72) Inventors: Noah Singer, White Plains, NY (US); Jeffrey Allen Zitz, Poughkeepsie, NY (US); Mark D. Schultz, Ossining, NY (US); John Torok, Poughkeepsie, NY (US); Yuet-Ying Yu, Hopewell Junction, NY (US); William L. Brodsky, Binghamton, NY (US); Shawn Canfield, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 17/304,856

(22) Filed: Jun. 28, 2021

(65) Prior Publication Data
US 2022/0418129 A1    Dec. 29, 2022

(51) Int. Cl.
*H05K 5/02*     (2006.01)
*H05K 5/03*     (2006.01)

(52) U.S. Cl.
CPC ............. *H05K 5/0221* (2013.01); *H05K 5/03* (2013.01)

(58) Field of Classification Search
CPC ............................... H05K 5/0221; H05K 5/03
See application file for complete search history.

(56) References Cited

U.S. PATENT DOCUMENTS

| | | | |
|---|---|---|---|
| 5,533,256 A | 7/1996 | Call | |
| 5,986,882 A | 11/1999 | Ekrot | |
| 6,086,387 A | 7/2000 | Gallagher | |
| 6,377,452 B1 | 4/2002 | Sasaki | |
| 6,932,622 B2 * | 8/2005 | Liao | H05K 7/1053 439/73 |
| 6,992,382 B2 | 1/2006 | Chrysler | |
| 7,030,638 B2 | 4/2006 | Stutzman | |
| 7,147,483 B1 * | 12/2006 | Ju | H05K 7/1053 439/73 |
| 7,149,087 B2 | 12/2006 | Wilson | |
| 7,239,518 B2 | 7/2007 | Yang | |
| 7,272,006 B2 | 9/2007 | Mongia | |
| 7,480,146 B2 | 1/2009 | Coleman | |
| 7,499,279 B2 | 3/2009 | Campbell | |
| 7,562,617 B2 | 7/2009 | Di Stefano | |

(Continued)

OTHER PUBLICATIONS

IBM: List of IBM Patents or Patent Applications Treated as Related (Appendix P), Aug. 24, 2021, 2 pages.

(Continued)

*Primary Examiner* — Sagar Shrestha
(74) *Attorney, Agent, or Firm* — L. Jeffrey Kelly

(57) ABSTRACT

An electronic module assembly is provided. The electronic module assembly may include one or more processors mounted to a laminate, a top frame mounted to the laminate and surrounding the one or more processors, and a removable lid covering the one or more processors. The removable lid includes latches arranged along a perimeter of the removable lid, the latches engage with a lip of the top frame and secure the removable lid to the module assembly, and the removable lid can only be removed from the module assembly by releasing all of the latches.

19 Claims, 7 Drawing Sheets

(56) References Cited

U.S. PATENT DOCUMENTS

| | | | |
|---|---|---|---|
| 7,632,115 B1* | 12/2009 | Polnyi | H05K 7/1053 |
| | | | 439/135 |
| 7,677,912 B2 | 3/2010 | Zhang | |
| 7,749,014 B2* | 7/2010 | Chiang | H01L 23/32 |
| | | | 439/73 |
| 7,824,188 B2 | 11/2010 | Yokoyama | |
| 7,826,229 B2 | 11/2010 | Cromwell | |
| 7,864,537 B2 | 1/2011 | Kim | |
| 7,905,106 B2 | 3/2011 | Attlesey | |
| 7,916,483 B2 | 3/2011 | Campbell | |
| 7,946,881 B2 | 5/2011 | Hsieh | |
| 8,144,469 B2 | 3/2012 | Kyle | |
| 8,172,597 B1* | 5/2012 | Terhune, IV | H01R 12/89 |
| | | | 439/73 |
| 8,279,606 B2 | 10/2012 | Kyle | |
| 8,562,367 B2 | 10/2013 | Yokoyama | |
| 8,760,870 B2 | 6/2014 | Yamamoto | |
| 8,834,191 B2* | 9/2014 | Yeh | H01R 12/88 |
| | | | 439/73 |
| 8,979,565 B2* | 3/2015 | Yeh | H01R 12/88 |
| | | | 439/331 |
| 9,054,473 B2 | 6/2015 | Kyle | |
| 9,192,070 B2* | 11/2015 | Tan | H05K 7/10 |
| 9,214,754 B2* | 12/2015 | Yeh | H01R 13/516 |
| 9,245,818 B2 | 1/2016 | Boyd | |
| 9,270,035 B2* | 2/2016 | Yeh | H05K 7/10 |
| 9,270,050 B2* | 2/2016 | Liu | H01R 13/5213 |
| 9,590,332 B2* | 3/2017 | Peng | H05K 7/1069 |
| 9,705,264 B2 | 7/2017 | Kyle | |
| 9,730,351 B2* | 8/2017 | Hsu | H05K 7/1092 |
| 9,853,380 B2 | 12/2017 | Narumi | |
| 10,111,365 B1 | 10/2018 | Junkins | |
| 10,466,273 B1 | 11/2019 | Hwang | |
| 10,541,487 B2* | 1/2020 | Wu | H01R 12/7076 |
| 10,575,438 B1 | 2/2020 | Yatskov | |
| 10,674,624 B2* | 6/2020 | Wu | H05K 7/1007 |
| 10,741,952 B2 | 8/2020 | Wu | |
| 10,874,032 B2 | 12/2020 | Leigh | |
| 10,925,186 B2 | 2/2021 | Selvidge | |
| 11,244,882 B2 | 2/2022 | Hachuda | |
| 2006/0050483 A1 | 3/2006 | Wilson | |
| 2008/0045048 A1* | 2/2008 | Ma | H05K 7/1061 |
| | | | 439/73 |
| 2008/0130221 A1 | 6/2008 | Varadarajan | |
| 2008/0266799 A1 | 10/2008 | Campbell | |
| 2009/0213541 A1 | 8/2009 | Butterbaugh | |
| 2010/0103620 A1 | 4/2010 | Campbell | |
| 2010/0130048 A1* | 5/2010 | Fan | H05K 7/1053 |
| | | | 439/331 |
| 2011/0287639 A1* | 11/2011 | Hsu | H05K 7/1007 |
| | | | 439/310 |
| 2014/0092573 A1* | 4/2014 | Llapitan | H05K 7/1007 |
| | | | 257/E23.179 |
| 2014/0199873 A1* | 7/2014 | Liu | H01R 13/62 |
| | | | 29/831 |
| 2019/0069429 A1* | 2/2019 | Lu | H05K 7/1427 |
| 2019/0252813 A1 | 8/2019 | Wu | |
| 2020/0260615 A1 | 8/2020 | Leigh | |
| 2020/0400786 A1* | 12/2020 | Kakimoto | G01V 8/20 |

OTHER PUBLICATIONS

Pending U.S. Appl. No. 17/304,855, filed Jun. 28, 2021, entitled: "Rotating Lid for Module Cooler", 30 pages.

* cited by examiner

TEMPORARY REMOVABLE MODULE LID

BACKGROUND

The present invention generally relates to cooling of computing system environments, and more particularly to a temporary removable module lid for protecting the module and enabling a removable cooling apparatus.

The industry trend has been to continuously increase the number of electronic components inside computing systems and the power consumed by existing components. Given the limited footprint of many computing systems, a continuous increase in the number of heat generating components creates challenging heat dissipation issues. These issues if not dealt with adequately can harm the structural and data integrity of the computer system, making the effect felt both at a system and module level.

In recent years, direct or indirect liquid cooling has become a more attractive option for the designers of computing systems. Liquid cooling has been shown to be substantially less burdensome both in terms of energy costs and resource allocations, especially for use in data centers.

Traditionally, indirect liquid cooling techniques incorporate a cold plate disposed adjacent to a circuit module or chip. Cooling liquid is provided inside the cold plate from a coolant supply and circulated by entering an inlet port and exiting through an outlet port. Heat from the electronic components (module/chip) is conducted to the mating surface of the cold plate and then transferred to the cooling liquid. In such arrangements, the cooling liquid would be completely sealed off from the electronic components and only used to provide indirect liquid cooling to the electronic components.

SUMMARY

According to an embodiment of the present invention, an electronic module assembly is provided. The electronic module assembly may include one or more processors mounted to a laminate, a top frame mounted to the laminate and surrounding the one or more processors, and a removable lid covering the one or more processors. The removable lid includes a first set of latches arranged on opposite sides of the removable lid, and a second set of latches arranged on opposite ends of the removable lid, both the first set of latches and the second set of latches engage with a lip of the top frame and secure the removable lid to the module assembly, the removable lid can only be removed from the module assembly by releasing all latches, the first set of latches are releasable only upon closing of a wire bale used to secure the module assembly to a processor board and the second set of latches are releasable by human fingers.

According to another embodiment of the present invention, an electronic module assembly is provided. The electronic module assembly may include one or more processors mounted to a laminate, a top frame mounted to the laminate and surrounding the one or more processors, and a removable lid covering the one or more processors. The removable lid includes latches arranged along a perimeter of the removable lid, the latches engage with a lip of the top frame and secure the removable lid to the module assembly, the removable lid can only be removed from the module assembly by releasing all latches, and some, but not all, of the latches of the removable lid are releasable only upon closing of a wire bale used to secure the module assembly to a processor board.

According to another embodiment of the present invention, an electronic module assembly is provided. The electronic module assembly may include one or more processors mounted to a laminate, a top frame mounted to the laminate and surrounding the one or more processors, and a removable lid covering the one or more processors. The removable lid includes latches arranged along a perimeter of the removable lid, the latches engage with a lip of the top frame and secure the removable lid to the module assembly, and the removable lid can only be removed from the module assembly by releasing all of the latches.

BRIEF DESCRIPTION OF THE DRAWINGS

The following detailed description, given by way of example and not intended to limit the invention solely thereto, will best be appreciated in conjunction with the accompanying drawings, in which.

Figure 1:
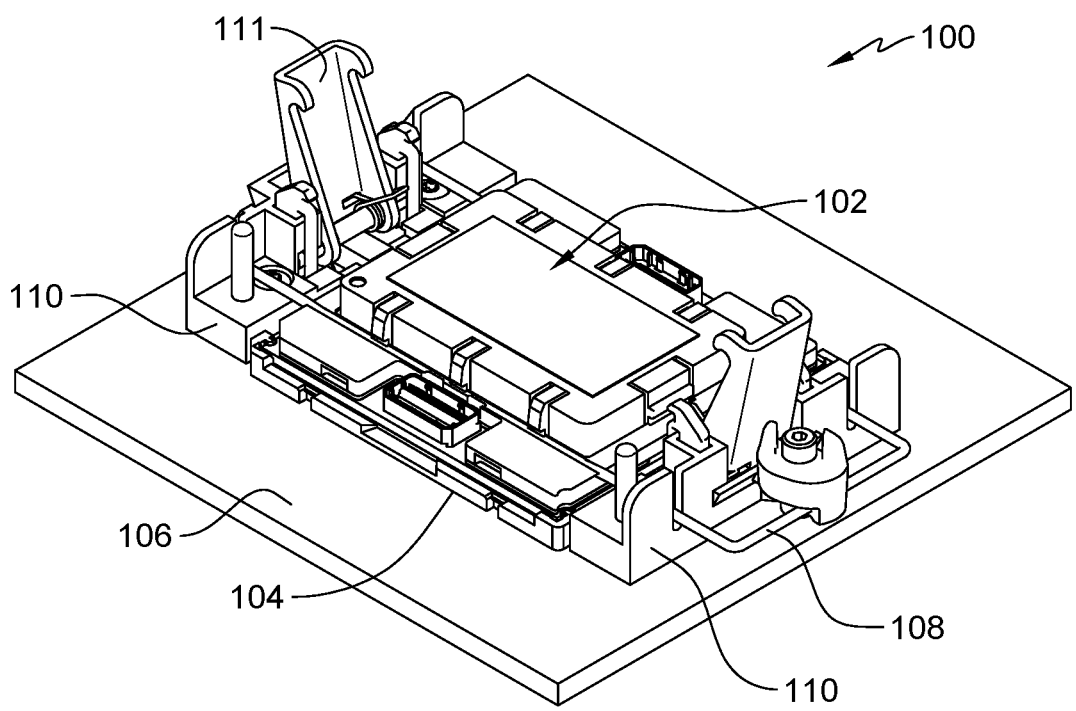
FIG. 1 is an isometric view of an electronic assembly according to an exemplary embodiment.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

System performance is heavily dependent on thermal management. Current thermal management strategies use a lidded module requiring two thermal interface material (hereinafter "TIM") interfaces. A first TIM interface exists between processor(s) and the lid, and a second TIM interface exists between the module lid and the cooling apparatus or cold plate. In such cases, cooling of the module requires heat to transfer from the processor(s) through the first TIM interface to the module lid, and then transfer from the module lid through the second TIM into the cooling apparatus. Cooling performance and efficiency decreases as the number of material interfaces increase. As such, a cooling arrangement with fewer TIM interfaces would have better cooling performance and cool the module more efficiently than conventional cooling arrangements with two or more TIM interfaces. Embodiments of the present invention eliminate the module lid and disclose a cooling arrangement with only one TIM interface.

Currently, conventional thermal management solutions used with a lidded module will not support anticipated cooling demands of future system power levels at desired operating frequency and chip yield. Eliminating the module lid in accordance with embodiments of the present embodiment is expected to improve cooling performance and efficiency and thereby meet the anticipated cooling demands of future systems. Eliminating the module lid and using a single TIM interface enables enhanced processor performance by reducing the thermal resistance. Eliminating the module lid in accordance with embodiments of the present invention further requires additional measures to physically protect the module during installation and maintenance, and thus requires a novel solution. As such there is a need for a structure that enables a removeable cooling apparatus a single TIM interface all while providing the necessary protection to the modules to prevent cracking or damage.

The present invention generally relates to cooling of computing system environments, and more particularly to a temporary removable module lid for protecting the module and enabling a removable cooling apparatus. Exemplary embodiments of a temporary removable module lid are described in detail below by referring to the accompanying drawings in FIGS. 1 to 13. Those skilled in the art will readily appreciate that the detailed description given herein with respect to these figures is for explanatory purposes as the invention extends beyond these limited embodiments.

Figure 2:
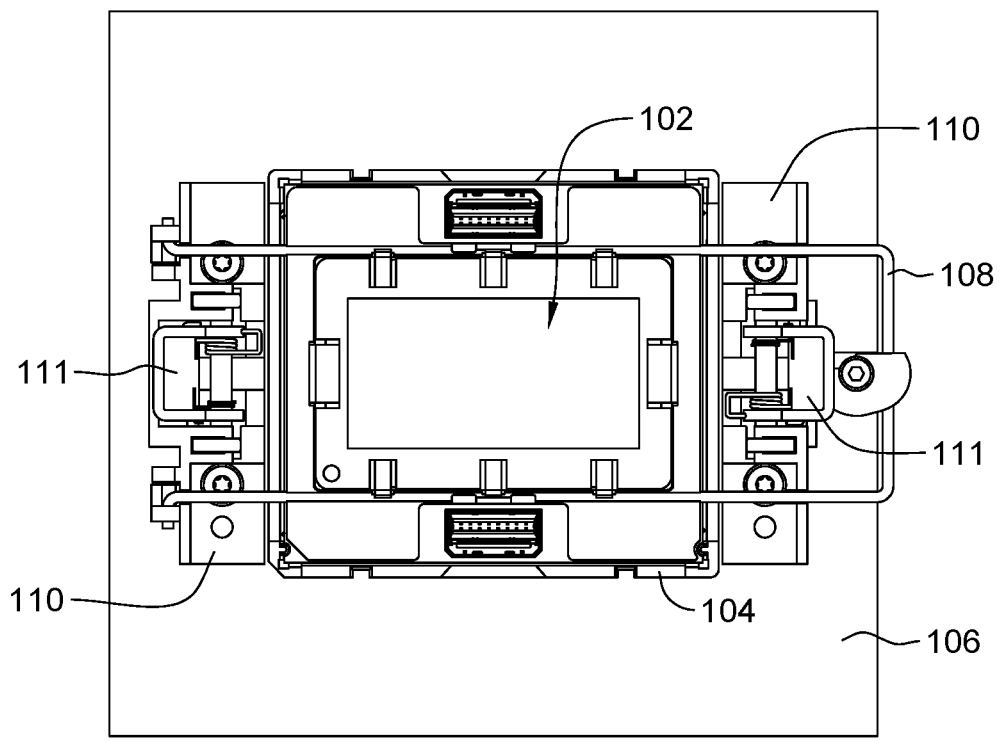
FIG. 2 is a top view of the electronic assembly according to an exemplary embodiment.
Figure 3:
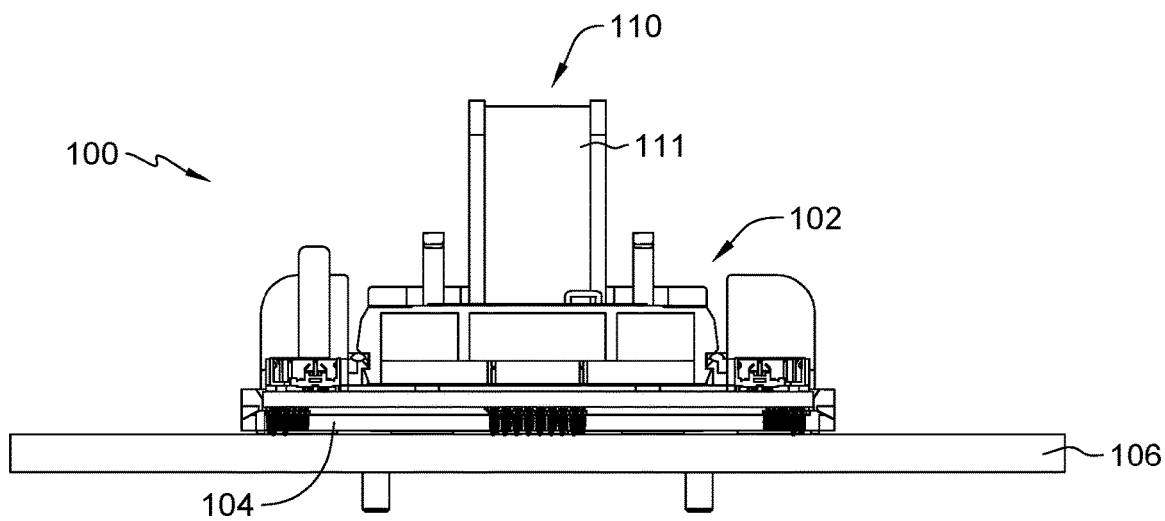
FIG. 3 is a cross-sectional view of the electronic assembly according to an exemplary embodiment.
Figure 4:
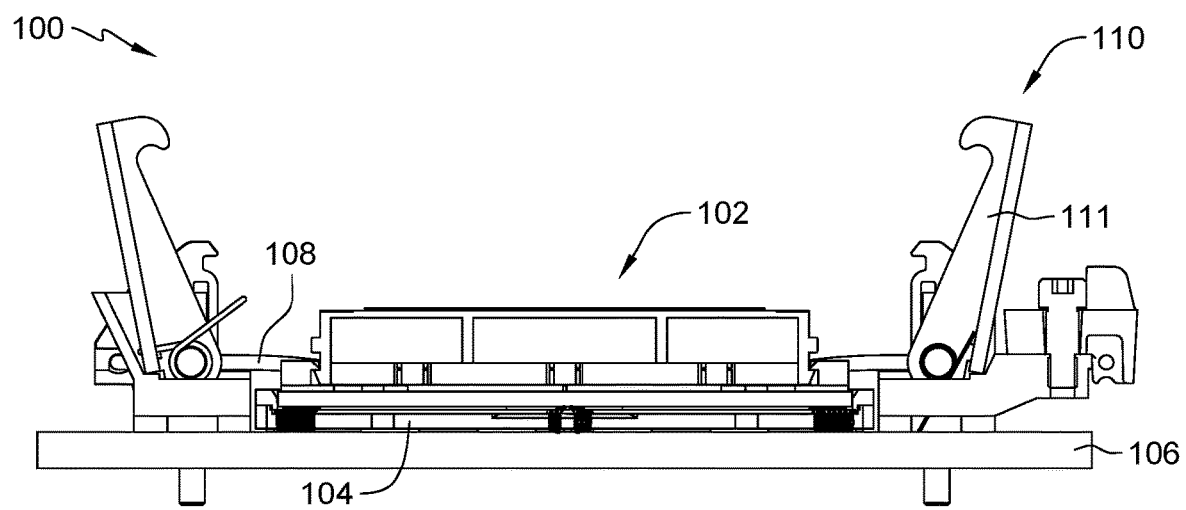
FIG. 4 is a cross-sectional view of the electronic assembly according to an exemplary embodiment.

Referring to FIGS. 1-4 multiple views of an electronic assembly 100 are shown according to an exemplary embodiment. FIG. 1 is an isometric view of the electronic assembly 100. FIG. 2 is a top view of the electronic assembly 100. FIGS. 3 and 4 are cross-sectional views of the electronic assembly 100 perpendicular to one another.

The electronic assembly 100 includes a module assembly 102 (hereinafter "module") removably attached to a socket 104 (or receptacle, such as, for example, LGA-type or BGA connector) on a processor board 106. The module 102 is secured to the processor board 106 and held in place by a wire bale 108. After installation, a temporary lid is removed from the module 102 and a cooling apparatus is placed and secured atop the module assembly with a load frame 110, as will be discussing in greater detail below.

The load frame 110 includes load latches 111 for securing a cooling apparatus (not shown) and load hardware (not shown) directly on top of the module 102. More specifically, the cooling apparatus must be in thermal contact with electronic components of the module 102 having the highest power dissipation densities. The load frame 110 applies a uniform load (force) on the module 102 to ensure adequate electrical connectivity between the module 102 and the processor board 106 as well as maintain a sufficient physical connection between the various components to ensure optimal thermal connectivity.

In conventional assemblies, the load frame 110 and associated load hardware would evenly distribute the load (force) from the load hardware to a module lid of the module; however, according to embodiments of the present invention the load frame 110 and associated load hardware apply a uniform load directly to the module 102 without a module lid. Therefore, in accordance with the embodiments disclosed herein, eliminating the module lid and placing the cooling apparatus directly on top of the processor(s)/chip(s) of the module 102 eliminates the TIM interface required between the module lid and the cooling apparatus. In turn, eliminating the TIM interface between the module lid and the cooling apparatus significantly reduces thermal resistance and increases overall performance of the electronic assembly 100.

Figure 5:
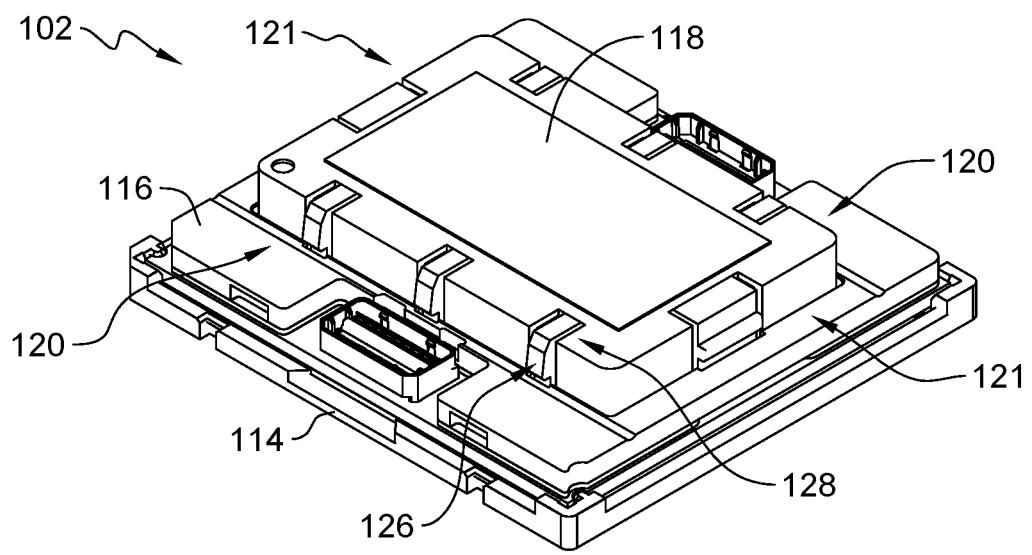
FIG. 5 is an isometric view of a module assembly according to an exemplary embodiment.
Figure 6:
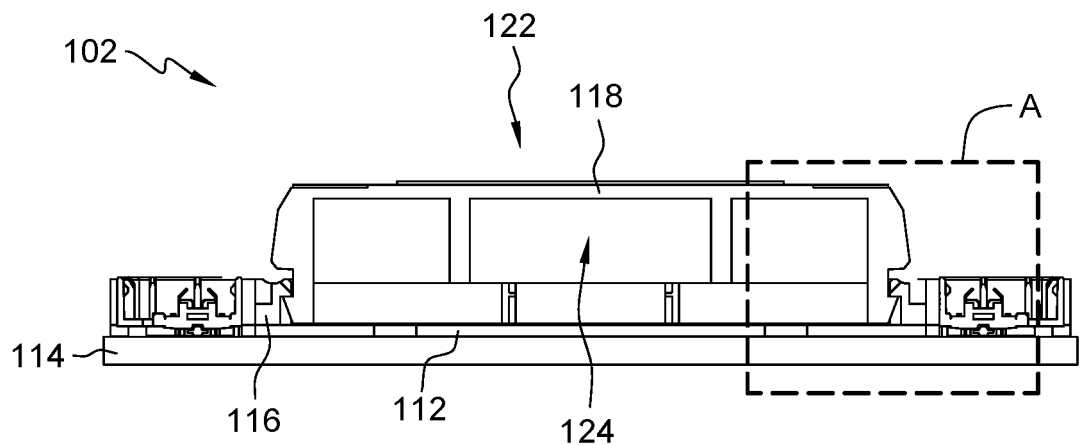
FIG. 6 is a cross-sectional view of the module assembly according to an exemplary embodiment.
Figure 7:
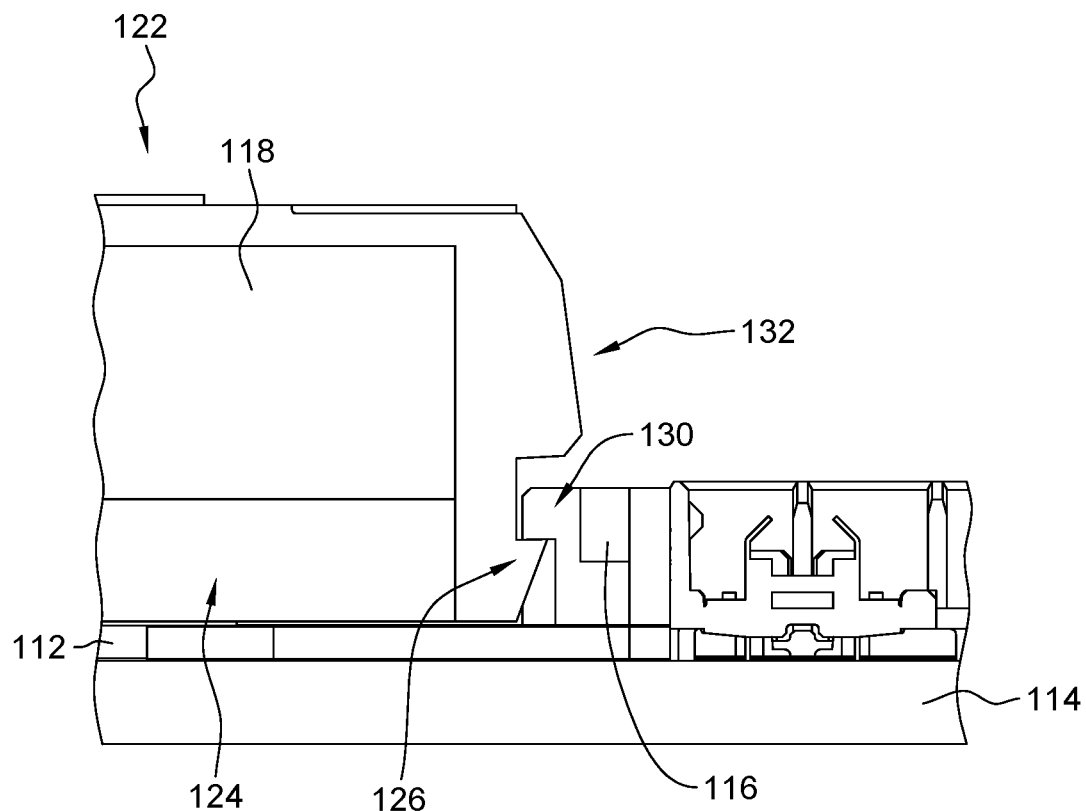
FIG. 7 is a section view, section A, of the module assembly of FIG. 6 according to an exemplary embodiment.
Figure 8:
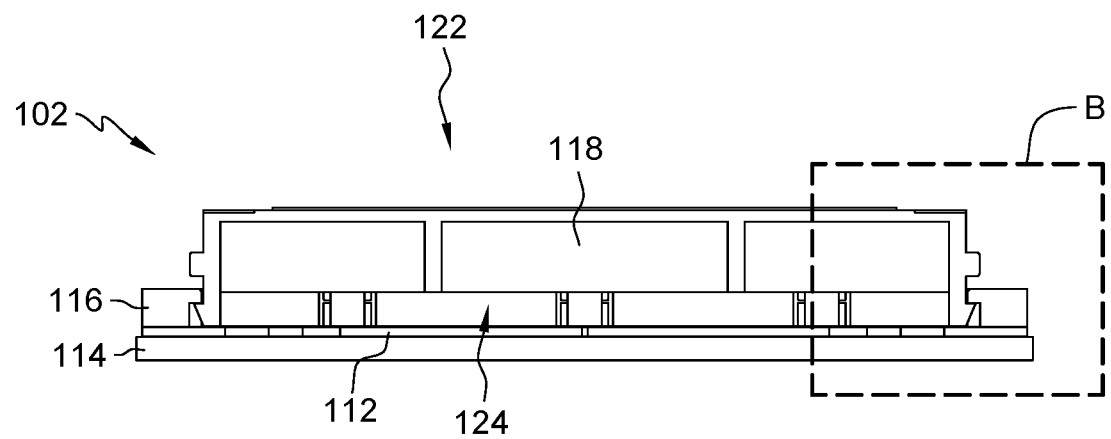
FIG. 8 is a cross-sectional view of the module assembly according to an exemplary embodiment.
Figure 9:
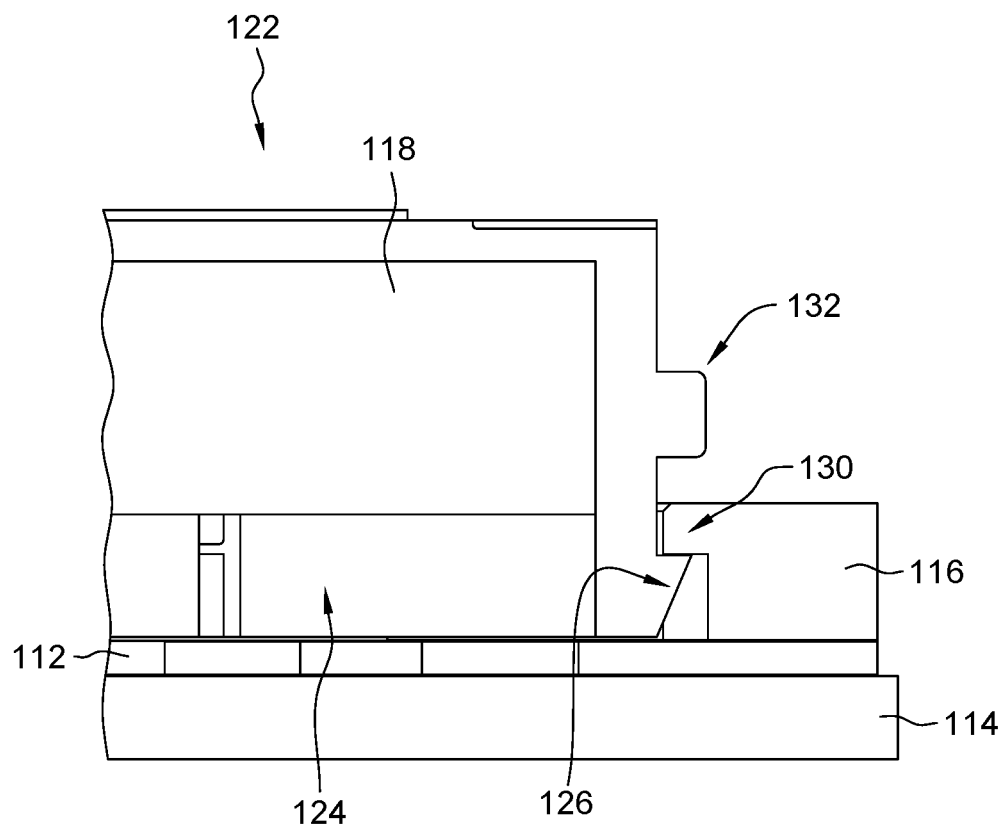
FIG. 9 is a section view, section B, of the module assembly of FIG. 8 according to an exemplary embodiment.

Referring to FIGS. 5-9 multiple views of the module 102 are shown according to an exemplary embodiment. FIG. 5 is an isometric view of the module 102. FIG. 6 is a cross-sectional view of the module 102. FIG. 7 is a section view of FIG. 6. FIG. 8 is a cross-sectional view of the module 102 perpendicular to the view of FIG. 6. FIG. 9 is a section view of FIG. 8.

The module 102, alternatively processor package or multi-chip module (MCM), may include one or more electronic components 112 secured to a laminate 114. The one or more electronic components mounted to the laminate 114 may include one or more of the following: application-specific integrated circuits (ASICs), several hybrid memory cubes (HMCs), dynamic random-access memory (DRAM) chips, trusted platform modules (TPMs), flash memory, ARM processors, Serial (PC) Electrically Erasable Programmable Read Only Memory (SEEPROM), and capacitors. Typically, those devices or components having/requiring have the highest power dissipation densities are located closest to the cooling apparatus.

The module 102 may further include a top frame 116 mounted to the laminate 114. In some embodiments, the top frame 116 completely surrounds all sides of the electronic components 112 and provides structural support to the laminate 114 to resist flexing and warping which can damage the module 102.

The module 102 further includes a removable temporary lid 118 (hereinafter temporary lid 118) which covers and protects the electronic components 112 of the module 102. More specifically, the temporary lid 118 remains installed during delivery and installation of the module 102 onto the processor board 106. Unlike conventional lidded modules, the temporary lid 118 disclosed herein is removed after the module 102 is installed onto the processor board 106. Removing the temporary lid 118 exposes the electronic components 112 and enables the placement of the cooling apparatus directly on top of the electronic components 112, such as, for example, the processor(s)/chip(s) of the module 102. As previously described, removing the lid 118 from the module 102 assembly eliminates one of two TIM interfaces thereby significantly reducing thermal resistance and increasing overall performance of the electronic assembly 100.

In general, the temporary lid 118 includes two sides 120, two ends 121, a top 122, and a recess 124 opposite the top 122; however, the general shape and number of sides are disclosed merely for purposes of illustration and do not limit the disclosed invention. The recess 124 is generally sized appropriately to accommodate the electronic components 112 secured to a laminate 114. The temporary lid 118 further includes multiple latches 126 arranged along a perimeter of the temporary lid 118. In an embodiment, the temporary lid 118 has at least one latch 126 on each of the two sides 120 and the two ends 121. In another embodiment, the temporary lid 118 has multiple latches 126, for example two or more, on each of the two sides 120 and the two ends 121. In yet another embodiment, the temporary lid 118 has one latch 126 on each of the two sides 120 and multiple latches 126 on each of the two ends 121, as shown in the figures.

In all cases, it is an object of the present invention that all of the latches 126 cannot be simultaneously released by an operator or maintenance personnel without an extra hand or special tools. Stated differently, all of the latches 126 cannot be simultaneously released using human fingers alone. Conceptually, one finger could be used to release each latch; however, doing so is realistically impossible due to (a) the small footprint of the module 102 and temporary lid 118, and (b) limited dexterity of human fingers.

Stated differently, the number and configuration of latches 126 is such that the temporary lid 118 cannot be removed from the module 102 without depressing or releasing each and every latch 126, and doing so by hand is either extremely difficult or impossible. For example, if the latches 126 were releasable by human fingers, embodiments of the present invention would require the latches be positioned such that an operator cannot possibly release all the latches 126. In another example, embodiments of the present invention might require the temporary lid 118 have a number latches 126 which exceeds that which can possibly be released by human fingers. In yet another embodiment, the shape and configuration of one or more of the latches 126 is such that they cannot be released by human fingers. For example, any release feature of such latches 126 would be too small to operate by human fingers.

In an embodiment, the temporary lid 118 and the latches 126 are made from the same material in a single manufacturing process. For example, temporary lid 118 and the latches 126 are both made from plastic via injection molding, 3D printing, or substrative machining techniques. Static dissipative plastics are preferable to control electrostatic discharge which could damage the electronic components 112 of the module 102

According to embodiments where the temporary lid 118 and the latches 126 are made from the same material, the spring function of the latches 126 is integrated and designed into the temporary lid 118. More specifically, each latch 126 may be spring loaded as a function of its design and an external, or additional, spring is unnecessary. For example, the latch profile may be formed at designated locations around the perimeter of the temporary lid 118 and relief cuts 128 are positioned adjacent to each latch 126 on both sides. Such relief cuts 128 physically disconnect the latch 126 from sidewalls of the temporary lid 118 such that the latch 126 remains connected to the body of the temporary lid 118 only at the top. As such the material at the top of the latch 126 where it connects to the body of the temporary lid 118 will bend or flex and provide the spring function. In such cases, the releasing the latches 126, and bending of the connecting materials should remain within the elastic deformation parameters of the material.

In a preferred embodiment, the relief cuts 128 are formed at the same time the temporary lid 118 is manufactured, for example, using an injection molding, 3D printing technique, or other additive manufacturing technique. In other embodiments, the relief cuts 128 may be added after the temporary lid 118 is manufactured using a cutting, sawing, or other substrative machining technique.

According to other embodiments, the latches 126 may be made from a different material than the body of the temporary lid 118 and physically attached to the perimeter of the temporary lid 118. For example, the temporary lid 118 may be made from plastic and the latches 126 may be made from metal (such as stainless steel) and physically secured to a perimeter of the temporary lid 118. In such cases, the temporary lid 118 would likely require designated pockets or recesses along the perimeter for placing the latches 126.

The latches 126 secure the temporary lid 118 to the top frame 116. More specifically, the latches 126 have a profile which engages with a corresponding lip 130 of the top frame 116. The lip 130 of the top frame 116 may be present along the entire perimeter of the top frame 116, or only in designated positions corresponding with locations of the latches 126. When installed, all of the latches 126 are engaged with the lip 130 of the top frame 116 such that the temporary lid 118 cannot be removed from the module 102 without depressing or releasing each and every latch 126.

Referring to FIGS. 10-13 multiple views of the electronic apparatus 100 are shown in operation according to embodiments of the present invention. Specifically, FIGS. 10-13 illustrate the use, functionality, and advantages of the temporary lid 118.

Figure 10:
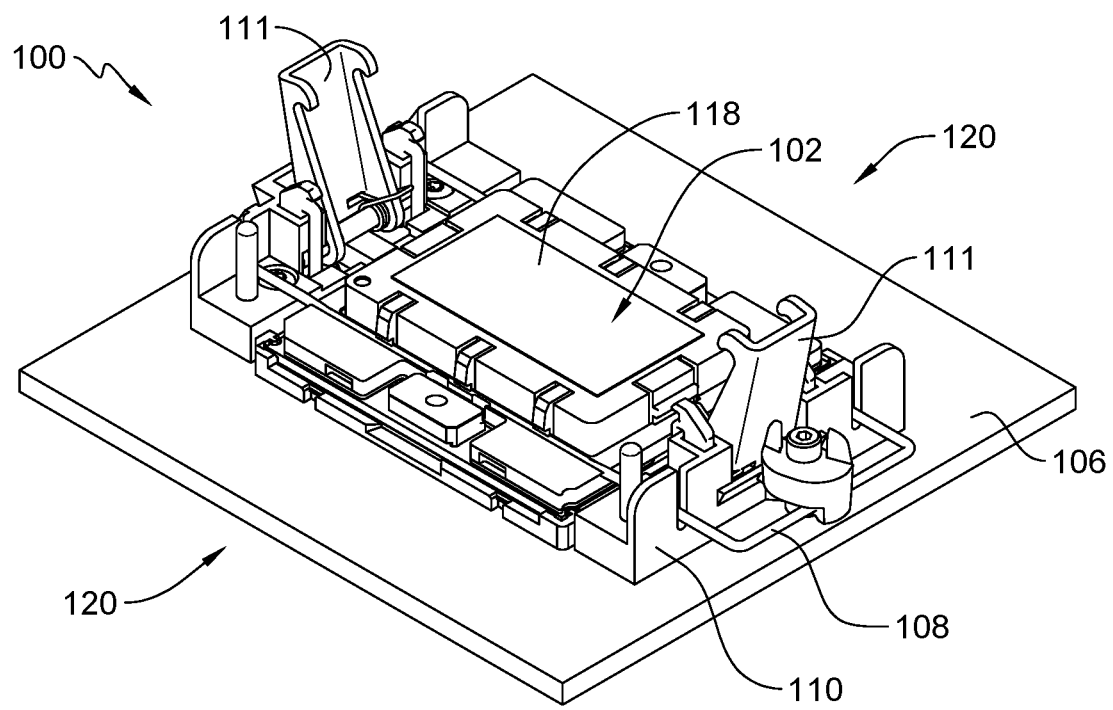
FIG. 10 is an isometric view of the electronic assembly in operation according to an exemplary embodiment.
Figure 11:
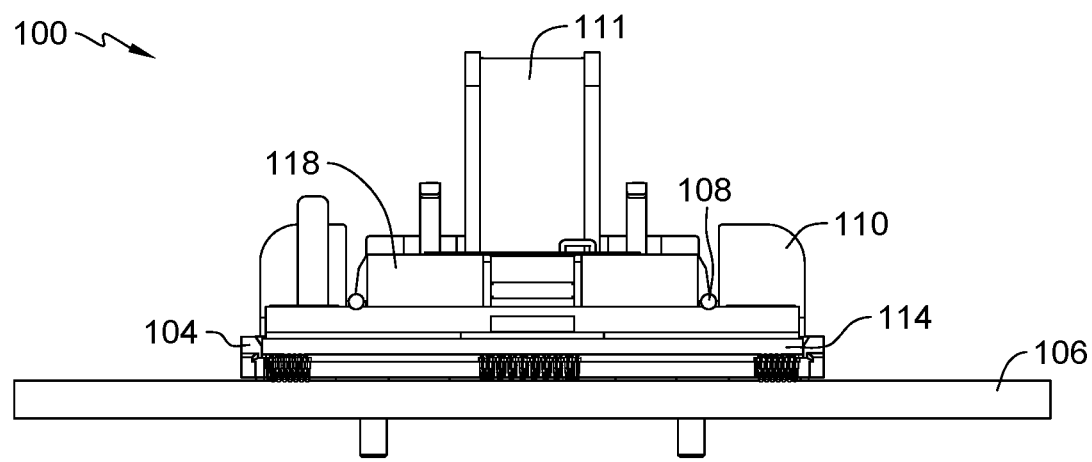
FIG. 11 is a cross-sectional view of the electronic assembly in operation according to an exemplary embodiment.

Referring to FIG. 10-11 the wire bale 108 is lifted to an open position and the module 102 is installed into the socket 104 on the processor board 106. Next, the wire bale 108 is lowered and secured in a closed position. In an embodiment, the wire bale 108 is made from metal wire, for example music wire. Once installed, the wire bale 108 applies a nominal amount of downward pressure to secure the module 102 to the processor board 106. The manufactured shape and design of the wire bale 108, in combination with the appropriate material, allows the wire bale 108 to elastically deform and produce the requisite downward pressure. Like the latches 126, the wire bale 108 is spring loaded as a function of its design.

In accordance with embodiments of the present invention, the wire bale 108 simultaneously releases all of the latches 126 on both of the sides 120 of the temporary lid 118. Specifically, as illustrated in the cross-section view of FIG. 11, the wire bale 108 directly contacts raised portions 132 of the latches 126 which protrude outward beyond sidewalls of the temporary lid 118.

As the wire bale 108 is lowered into the closed position, it gradually releases those latches 126 by depressing the raised portions 132 and flexing/bending the latches 126 inward toward a center of the temporary lid 118. In the closed position, the wire bale 108 indefinitely releases the latches 126. If the wire bale 108 is lifted to the open position before the temporary lid 118 is removed, the latches 126 will re-engage with the lip 130 of the top frame 116.

Once released, the latches 126 no longer engage with the lip 130 of the top frame 116. In all cases, the wire bale 108 cannot release all of the latches 126, but instead only the latches 126 arranged on the two opposite sides 120 of the temporary lid 118, as illustrated. As such, any latches 126 on the two opposite ends 121 will remain engaged with the lip 130 of the top frame 116 after the wire bale 108 is secured in the closed position. It is noted that the wire bale 108 is generally stiffer than the latches 126 such that the latches 126 will adequately disengage before the wire bale 108 deflects laterally.

Figure 12:
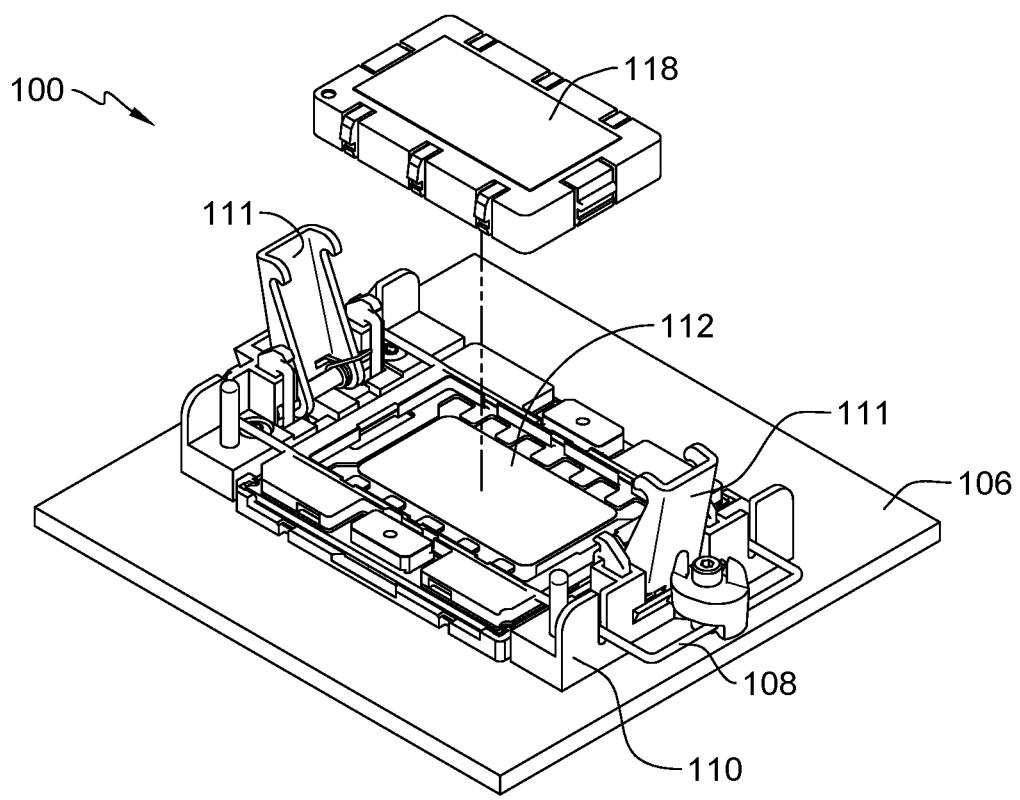
FIG. 12 is an isometric view of the electronic assembly in operation according to an exemplary embodiment.

Referring to FIG. 12 the module lid 118 is then removed from the module 102. Before doing so, any remaining latches 126 on the two opposite ends 121 must be released. As shown, according to an embodiment, the temporary lid 118 is designed with only one latch 126 on each of the two opposite ends 121 which are released by hand or human fingers. After releasing the two remaining latches 126 on the two opposite ends 121, the temporary lid 118 is lifted and removed by hand.

Figure 13:
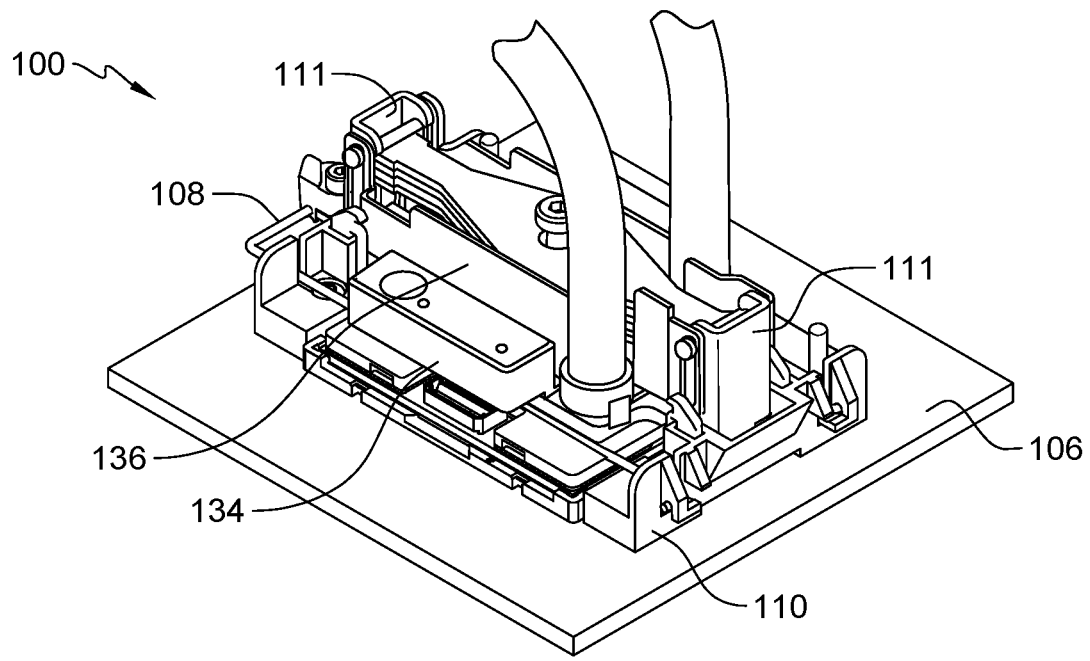
FIG. 13 is an isometric view of the electronic assembly in operation according to an exemplary embodiment.

Referring to FIG. 13 once the module 102 is installed onto the processor board 106 and the temporary lid 118 is removed, a cooling apparatus 134 and load hardware 136 are placed directly on top of the module 102, and specifically, directly on the electronic components 112 of the module 102 having the highest power dissipation densities. The load hardware 136 is secured with the load latches 111 of the load frame 110. As previously discussed, the load frame 110 applies a uniform load (force) on the module 102 to ensure adequate electrical connectivity between the module 102 and the processor board 106 as well as maintain a sufficient physical contact between the various components to ensure optimal thermal connectivity.

In the present embodiment, the cooling apparatus 134 and the load hardware 136 are a single integrated assembly. In such cases, the load hardware 136 ensures optimal alignment of the cooling apparatus 134. In other embodiments, the cooling apparatus 134 and the load hardware 136 are separate components stacked one on top of another.

In some embodiments, an elastomer (not shown) is positioned, or sandwiched, between the load hardware 136 and the cooling apparatus 134 to evenly distribute the load and maintain adequate thermal contact between the module 102 and the cooling apparatus 134. The elastomer can be any heat resistant elastomeric material known to person of ordinary skill in the art, such as, for example, Neoprene, EPDM and Viton rubbers.

As will be appreciated by persons having ordinary skill in the art, embodiments of the present invention make cooling the module 102 with only a single TIM interface possible. Unlike current solutions, only one TIM interface will separate the module 102 from the cooling apparatus 134. The single TIM interface improves cooling performance and efficiency, and thereby meets the anticipated cooling demands of high-performance future systems. More specifically, the proposed configuration described herein will improve cooling performance by at least 25% and eliminate the need for performance throttling of the module 102 to manage heat.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An electronic module assembly comprising:
one or more processors mounted to a laminate;
a top frame mounted to the laminate and surrounding the one or more processors;
a removable lid covering the one or more processors, wherein the removable lid comprises a first set of latches arranged on opposite sides of the removable lid, and a second set of latches arranged on opposite ends of the removable lid, both the first set of latches and the second set of latches engage with a lip of the top frame and secure the removable lid to the electronic module assembly, the removable lid can only be removed from the electronic module assembly by releasing all latches, and the first set of latches are releasable only upon closing of a wire bale used to secure the module assembly to a processor board and the second set of latches are releasable by human fingers.

2. The electronic module assembly according to claim 1, wherein the first set of latches comprises six latches three on each of the opposite sides of the removable lid, and the second set of latches comprises two latches one on each of the opposite ends of the removable lid.

3. The electronic module assembly according to claim 1, wherein the removable lid comprises at least one latch on each side of the removable lid.

4. The electronic module assembly according to claim 1, wherein the removable lid comprises two or more latches on each side of the removable lid.

5. The electronic module assembly according to claim 1, wherein all latches of the removable lid cannot be simultaneously released by the human fingers.

6. The electronic module assembly according to claim 1, wherein the latches are integrated into the design of the removable lid and both are made from the same continuous material.

7. An electronic module assembly comprising:
one or more processors mounted to a laminate;
a top frame mounted to the laminate and surrounding the one or more processors;
a removable lid covering the one or more processors,
wherein the removable lid comprises latches arranged along a perimeter of the removable lid, the latches engage with a lip of the top frame and secure the removable lid to the electronic module assembly, the removable lid can only be removed from the module assembly by releasing all latches, and some, but not all, of the latches of the removable lid are releasable only upon closing of a wire bale used to secure the electronic module assembly to a processor board.

8. The electronic module assembly according to claim 7, wherein the latches of the removable lid are arranged on all four sides of the removable lid.

9. The electronic module assembly according to claim 7, wherein the removable lid comprises at least one latch on each side of the removable lid.

10. The electronic module assembly according to claim 7, wherein the removable lid comprises two or more latches on each side of the removable lid.

11. The electronic module assembly according to claim 7, wherein all latches of the removable lid cannot be simultaneously released by human fingers.

12. The electronic module assembly according to claim 7, wherein the latches are integrated into the design of the removable lid and both are made from the same continuous material.

13. An electronic module assembly comprising:
one or more processors mounted to a laminate;
a top frame mounted to the laminate and surrounding the one or more processors;
a removable lid entirely covering top surfaces of the one or more processors,
wherein the removable lid comprises integral spring-loaded latches arranged on opposite sides of the removable lid, the integral spring-loaded latches engage with a lip of the top frame and secure the removable lid to the electronic module assembly, and the integral spring-loaded latches are releasable only upon closing of a wire bale used to secure the electronic module assembly to a processor board.

14. The electronic module assembly according to claim 13, wherein the latches of the removable lid are arranged on all four sides of the removable lid.

15. The electronic module assembly according to claim 13, wherein the removable lid comprises at least one latch on each side of the removable lid.

16. The electronic module assembly according to claim 13, wherein the removable lid comprises two or more latches on each side of the removable lid.

17. The electronic module assembly according to claim 13, wherein latches arranged along the perimeter of the removable lid comprise a first set of latches arranged on opposite sides of the removable lid, and a second set of latches arranged on opposite ends of the removable lid.

18. The electronic module assembly according to claim 13, wherein all latches of the removable lid cannot be simultaneously released by human fingers.

19. The electronic module assembly according to claim 13, wherein the latches are integrated into the design of the removable lid and both are made from the same continuous material.

* * * * *